United States Patent [19]
Kanehiro

[11] Patent Number: 4,822,468
[45] Date of Patent: Apr. 18, 1989

[54] BARREL PLATING APPARATUS

[76] Inventor: Takashi Kanehiro, 121-Banchi, Shiki-cho, Minami, 4-chome, Yao-shi, Osaka, Japan

[21] Appl. No.: 205,742

[22] Filed: Jun. 13, 1988

[30] Foreign Application Priority Data

Dec. 1, 1987 [JP] Japan .................................. 62-304916

[51] Int. Cl.⁴ ............................................ C25D 17/20
[52] U.S. Cl. ..................................................... 204/213
[58] Field of Search ......................................... 204/213

[56] References Cited
FOREIGN PATENT DOCUMENTS

| 1008620 | 5/1954 | France | 204/213 |
| 356315 | 1/1973 | U.S.S.R. | 204/213 |

Primary Examiner—T. M. Tufariello
Attorney, Agent, or Firm—Moonray Kojima

[57] ABSTRACT

A barrel plating apparatus for forming, by electroplating or electroless plating, a layer on surfaces of articles formed of ceramics such as zirconia for use as resistors, condensors or other electrical parts or elements mounted on printed circuit boards, for example. The apparatus comprises a hollow barrel rotatably supported by a pair of vertical plates spaced apart from each other, and unrotatable agitators housed in the barrel and including a plurality of agitating balls for agitating the articles under plating treatment. The barrel in rotation and the agitating balls produce a combined effect for agitating the articles to the full. The articles are thus plated with coatings of uniform thickness and reliable adhesion.

8 Claims, 5 Drawing Sheets

BARREL PLATING APPARATUS

BACKGROUND OF THE INVENTION (1) Field of the Invention

The present invention relates to barrel plating apparatus for forming, by electroplating or electroless plating, a layer on surfaces of articles formed of ceramics such as zirconia for use as resistors, condensors or other electrical parts or elements mounted on printed circuit boards for example.

(2) Description of the Prior Art

Among known plating apparatus as noted above, there is a horizontal barrel plating apparatus of the partial immersion type which comprises a pair of vertical plates opposed to each other in spaced relationship, and a hexagonal hollow barrel extending between and rotatably supported by the vertical plates to be driven by an AC motor. The hollow barrel includes a tubular barrel wall extending between blank plates disposed at opposite ends of the barrel, and this barrel wall is formed of a porous plate throughout.

In electroplating surfaces of ceramic articles or elements such as of zirconia ($ZrO_2$) by using the above barrel plating apparatus, the articles are coated with a nickel layer by electroless plating in advance and then the articles coated with the nickel layer are placed in the hollow barrel for electroplating. With the conventional barrel plating apparatus, the articles are subjected only to a negative or passive agitating action of the barrel in rotation. Consequently, the agitation of the articles tends to be insufficient thereby to give rise to the problem of lack of uniformity in the plating thickness and adhesive failure.

SUMMARY OF THE INVENTION

A primary object of the present invention is to provide a barrel plating apparatus capable of sufficiently agitating articles thereby to plate the articles with a coating of uniform thickness and without any adhesive failure. To achieve this object, the plating apparatus comprises a plurality of agitating balls disposed in a hollow barrel for agitating the articles. The articles are fully agitated by a positive agitating action of the agitating balls in combination with a negative or passive agitating action of the barrel in rotation.

Another object of the invention is to provide a barrel plating apparatus capable of agitating articles with increased efficiency. To this end, the above-mentioned agitating balls are arranged along an imaginary parabola such that the agitating balls at intermediate positions are disposed farther away from the bottom of the hollow barrel than the agitating balls at end positions.

A further object of the invention is to provide a barrel plating apparatus capable of agitating articles with even greater efficiency. This object is achieved by a construction wherein the agitating balls are attached through conductive rods to a barrel electrode extending axially of the hollow barrel, the conductive rods being inclined in a direction of barrel rotation such that an axis of each conductive rod and each agitating ball extends at an angle to a perpendicular extending through a center of the barrel electrode. Other objects of the present invention will be apparent from the following description of the preferred embodiment.

BRIEF DESCRIPTION OF THE DRAWINGS

The drawings illustrate an embodiment of the present invention, in which.

DESCRIPTION OF THE PREFERRED EMBODIMENT

An embodiment of the present invention will be described in detail hereinafter with reference to the drawings.

Figure 1:
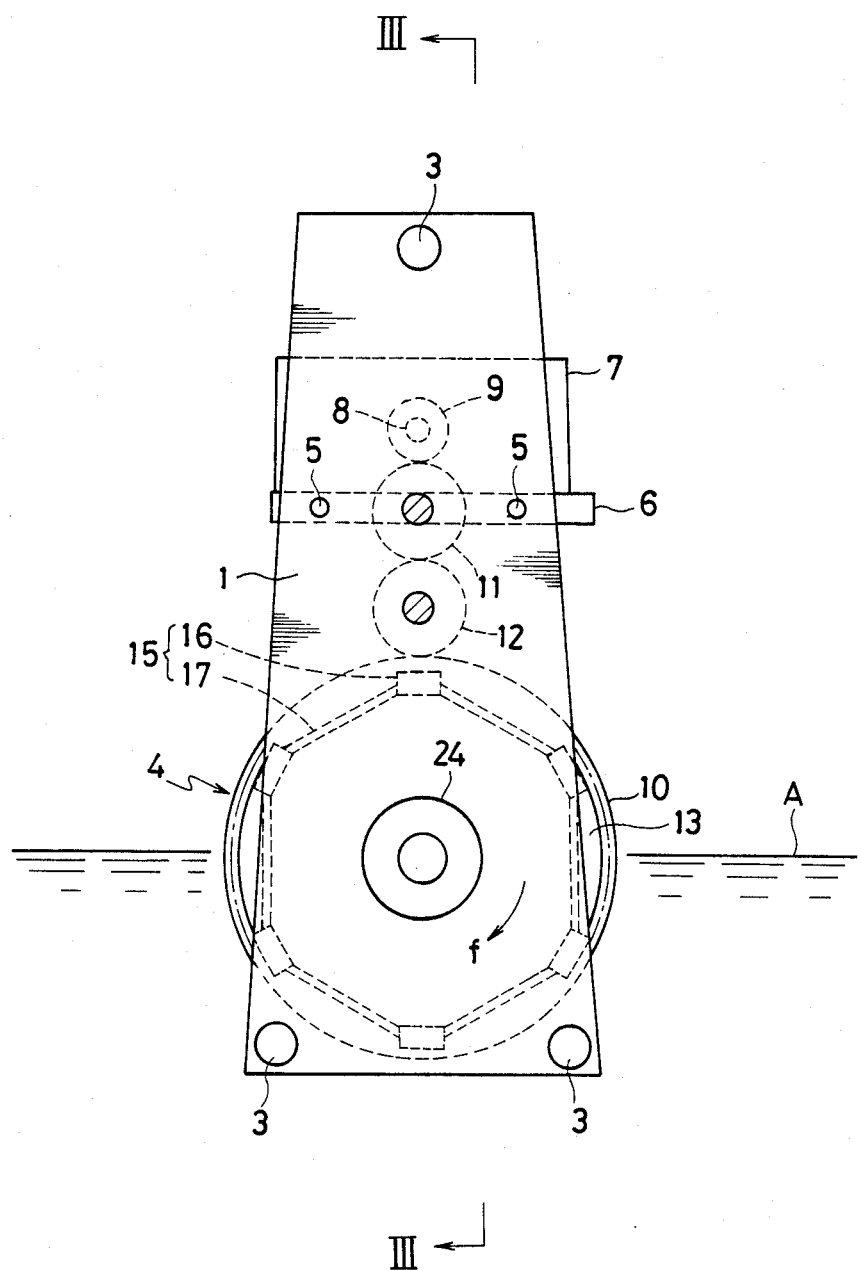
FIG. 1 is a front view of a horizontal barrel plating apparatus of the partial immersion type.
Figure 2:
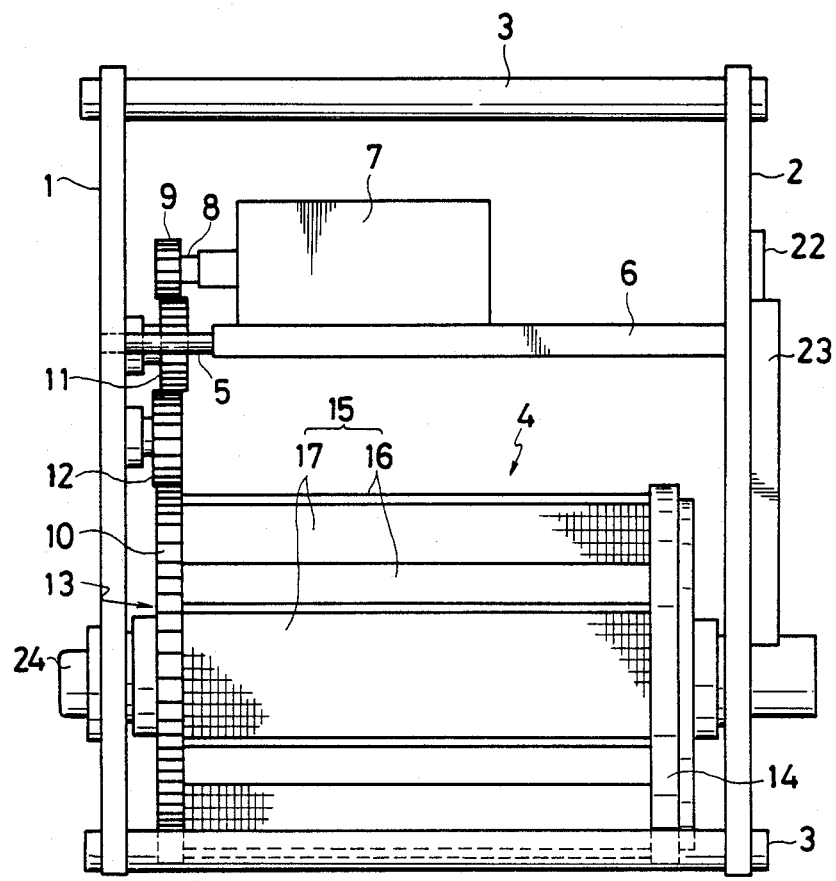
FIG. 2 is a side view of the plating apparatus.

Referring to FIGS. 1 and 2, a horizontal barrel plating apparatus of the partial immersion type according to the invention comprises a pair of vertical plates 1 and 2 suitably spaced from each other, and a plurality of stays 3 interconnecting the two vertical plates 1 and 2 at top middle positions and bottom corners thereof.

The vertical plates 1 and 2 rotatably support a hexagonal hollow barrel 4 extending between lower positions thereof. Upwardly of the barrel 4 is a motor base 6 extending horizontally and supported by the vertical plates 1 and 2 through two mounting pins 5.

The motor base 6 supports a DC geared motor 7 having a speed governor not shown. This motor 7 includes a rotary shaft 8 carrying a drive gear 9.

The drive gear 9 is in driving engagement, through two idle gears 11 and 12 supported by one of the vertical plates 1, with a ring gear 10 rigidly mounted around the periphery of an end plate 13 of the barrel 4. Thus, the DC geared motor 7 is operable to drive the barrel 4 through the gears 9, 11, 12 and 10, whereby the barrel 4 rotates in a plating solution A in the direction of arrow f in FIGS. 1 and 4.

Figure 3:
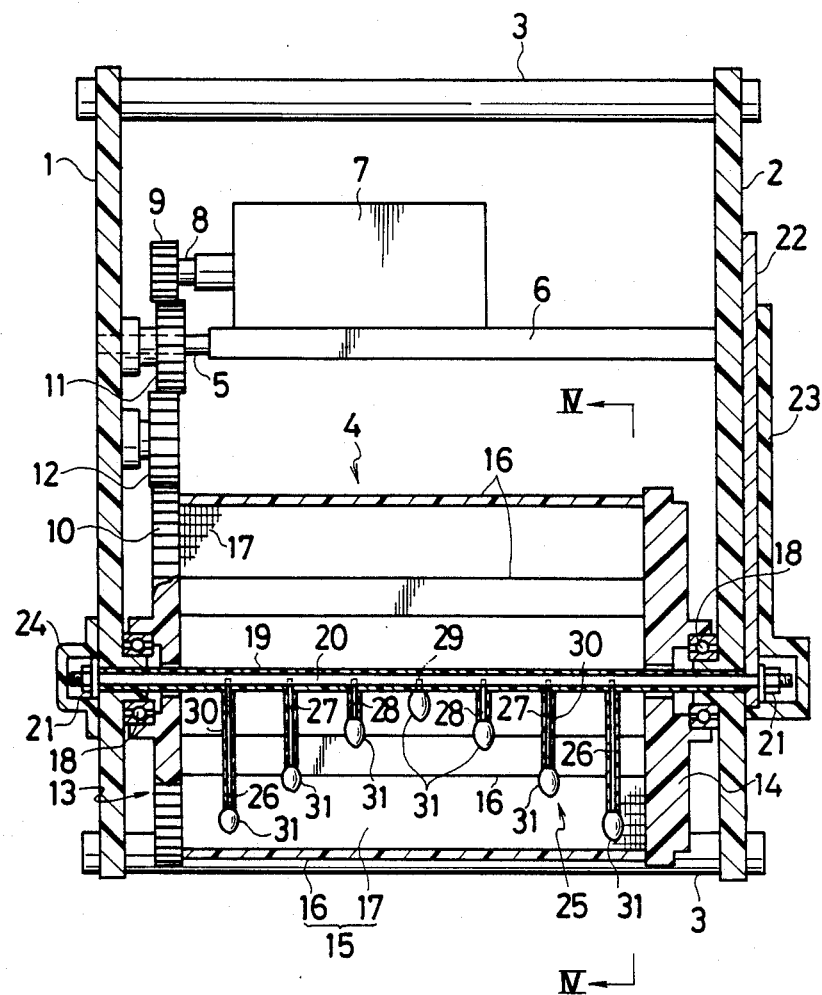
FIG. 3 is a section taken on line III—III of FIG. 1.

As shown in FIGS. 2 and 3, the barrel 4 has a tubular barrel wall 15 extending between opposite end plates 13 and 14. The barrel wall 15 includes a plurality of cross beams 16 extending along ridges of the hexagonal barrel 4, and a porous plate 17 having an appropriate mesh for allowing the plating solution A to flow into and out of the barrel 4. The barrel wall 15 includes a lid removably mounted on one side thereof for receiving articles to be plated. This removable lid is well known in the art, and is therefore omitted from the drawings.

The barrel 4 is supported by the pair of vertical plates 1 and 2 through bearings 18, and is penetrated through its axial center position by a barrel electrode 20 formed of brass and covered by a coating 19 such as a heat resisting vinyl chloride pipe. The barrel electrode 20 is supported at opposite ends thereof by the vertical plates 1 and 2 and fixed against rotation by nuts 21.

A negative electrode 22 is mounted on the back face of the other vertical plate 2. This negative electrode 22 is electrically connected at a lower end thereof to the barrel electrode 20, and is covered by an insulating shroud 23.

The end of the barrel electrode 20 projecting outwardly of the vertical plate 1 at the lefthand side in FIGS. 2 and 3 is covered by an insulating cap 24 formed of a heat resisting plastic material.

The barrel electrode 20 carries unrotatable agitators 25 for agitating articles under plating treatment. These agitators 25 have agitating balls 31, to be described later, which are replaceable with heat resisting plastic balls for an electroless plating operation. At times of electroplating, the agitators 25 perform an electrifying function as well as the agitating function.

More particularly, as shown in FIGS. 3 through 6, the agitators 25 comprise conductive brass rods 26–29 of varied lenths extending from the barrel electrode 20 into the plating solution A. These conductive rods 26–29 are covered by coatings 30 such as heat resisting vinyl chloride pipes. Each of the conductive rods 26–29 defines a threaded hole 32 at a lower end thereof to which the agitating ball 31 formed of brass is rigidly mounted by means of a screw 31a. These agitating balls 31 act to negatively charge the articles at times of electroplating.

In other words, brass balls are used as the agitating balls 31 for an electroplating operation and heat resisting plastic balls for an electroless plating operation. This arrangement enables a single barrel plating apparatus to carry out both the electroplating and the electroless plating.

Figure 6:
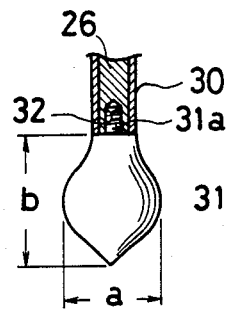
FIG. 6 is an explanatory view of an agitating

As shown in FIG. 6, each agitating ball 31 has a ratio of diameter a to length b set in the range of 1:1.5 to 1:2, and has an elongated and, approximately, inverted onion shape.

Figure 5:
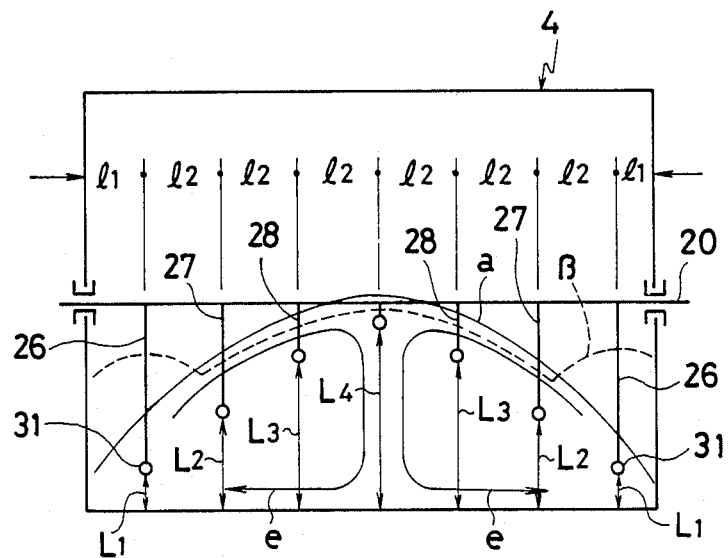
FIG. 5 is an explanatory view for illustrating an agitating state.

Referring to FIG. 5, the agitating balls 31 have lower ends thereof located at distances L1, L2, L3 and L4 from the barrel bottom, respectively. The agitating balls 31 at opposite ends axially of the barrel electrode 20 are located at a distance l1 from the respective vertical plates 1 and 2, with an adjacent pair of agitating balls 31 spaced from each other by a distance l2. As a result, the agitating balls 31 are arranged on an imaginary parabola.

Figure 4:
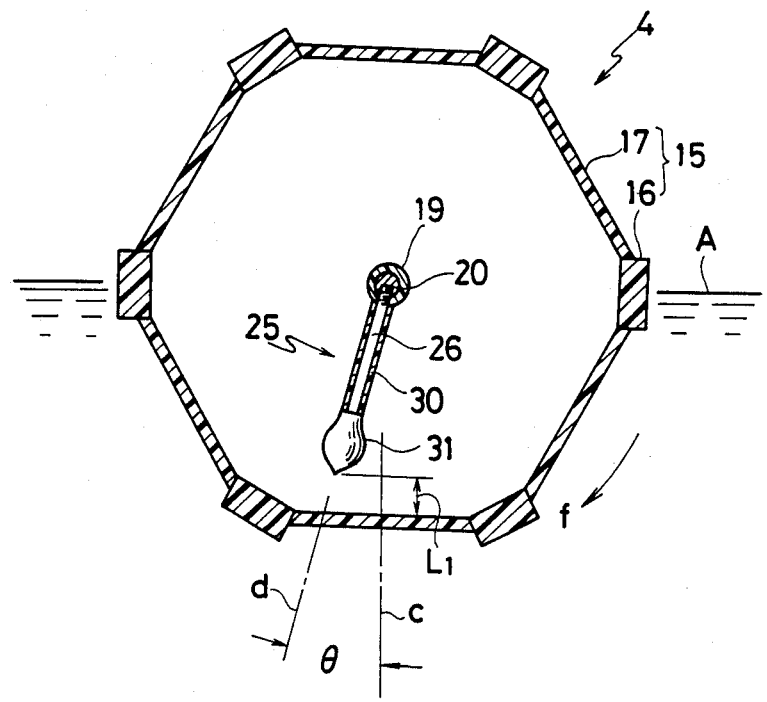
FIG. 4 is a section of a portion of the plating apparatus taken on line IV—IV of FIG. 3.

Further, as shown in FIG. 4, the conductive rods 26–29 are inclined in the direction of barrel rotation such that an axis d of each conductive rod and each agitating ball extends at an angle $\theta$ to a perpendicular c extending from the center of barrel electrode 20.

How the illustrated embodiment operates will be described hereinafter.

In electroplating ceramic articles such as of zirconia, for example, the articles are subjected to electroless plating in advance to form a nickel layer of about 0.2 micron on article surfaces. Thereafter a plurality of the articles formed with the nickel layer are placed in the hollow barrel 4 in an amount corresponding to 50–55% of the barrel capacity.

The barrel 4 containing the articles is immersed to an appropriate depth in the plating solution A as shown in FIGS. 1 and 4. In this state, the barrel 4 is driven by the DC geared motor 7 to rotate in about 16–18 rpm, preferably 17 rpm. At this time the negative electrode 22 is negatively charged and an unillustrated positive electrode or anode provided outside the barrel 4 is positively charged. Then a metallic component of the plating solution A, which comprises a solution of metallic salt, crystallizes from the solution through an electrolytic reaction, whereby the negatively charged article surfaces are plated through a cathode reaction.

During the above plating reaction, the articles in the hollow barrel 4 are positively agitated by the plurality of agitating balls 31 of the unrotatable agitators 25. The articles are effectively agitated by this positive agitation combined with a negative agitation provided by the rotation of the barrel 4.

The foregoing values L1, L2, L3, L4, l1, l2, a, b, $\theta$ and the rate of barrel rotation may be set as follows, for example:

L1$\approx$15, L2 $\approx$35 to 40, L3$\approx$65, L4$\approx$85, l1$\approx$25, l2$\approx$35 to 50, a$\approx$15 to 20, $\approx$15a to 2a, (all in millimeters);

0$\approx$5 to 20°, being the smaller for the smaller size articles; and the rate of barrel rotation$\approx$16 to 18 rpm.

With the values set as above, a satisfactory agitating effect has been produced as illustrated in FIG. 5 wherein the articles move along a parabolic locus of agitation $\alpha$ and in the directions indicated by arrows e.

Where an agitating operation is carried out with the rate of barrel rotation set outside the range of 16–18 rpm, the angle $\theta$ set to a value exceeding 20 degrees, and the ratio of diameter a to lengh b of the agitating balls 31 outside the range of 1:1.5 to 1:2, the articles move along an erratic locus of agitation $\beta$ as shown in a dotted line in FIG. 5.

There is no theoretical explanation for achievement of the foregoing locus of agitation $\alpha$. However, the excellent agitating effect is believed to result from the interaction of various values as set out above.

Since the articles are fully agitated by the agitators 25, the articles are plated with coatings of uniform thickness and reliable adhesion In addition, non-magnetic plating is applicable to the articles of ceramics such as zirconia.

The above agitating effect is not limited to electroplating but may be achieved in electroless plating also.

Figure 7:
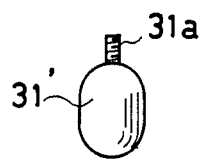
FIG. 7 is a side view of a modified agitating ball.
Figure 8:
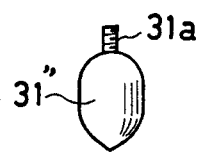
FIG. 8 is a side view of a further example of agitating ball.

FIGS. 7 and 8 show modified examples of agitating balls 31. The agitating ball 31' of FIG. 7 has an elliptic section. The same advantageous effect may be produced by the agitating ball 31" shown in FIG. 8 which has an elliptic section with a somewhat pointed end.

A nickel electrode is of course used as the positive electrode in nickel plating, a copper electrode in copper plating and a platinum titanium electrode in gold plating. The plating solution also should comprise a solution of metallic salt selected according to the kind of plating.

The term "agitating means" appearing in the appended claims corresponds to the agitators 25 in the foregoing embodiment. The term "articles under plating treatment" embraces electronic parts for mounting on printing circuit boards, and other small elements.

The present invention should not be understood as being limited to the described embodiment. For example, although the plating apparatus has been described in relation to treatment of ceramic articles, the apparatus of course is available for plating various small articles or parts of metals, plastics and other materials to form desired coatings on their surfaces.

The hexagonal hollow barrel 4 provides, by reason of its many-sided configuration, the negative agitation with every rotation thereof to produce a combined effect with the positive agitation by the agitators 25. However, the barrel 4 is not limited to the hexagonal shape but may take other polygonal shapes. The mesh of the porous plate 17 may be square, circular or other shapes. Naturally, the end plates 13 and 14 may also include porous portions to permit the plating solution to flow into and out of the barrel 4.

The DC geared motor 7 employed as the drive source for rotating the barrel 4 has the advantage of being small but providing a sufficient torque output.

I claim:

1. A barrel plating apparatus comprising
    a pair of vertical plates spaced apart from each other;
    a hollow barrel having two ends and an axis and supported at the two ends by said vertical plates;
    means for rotating said barrel; and
    agitating means for agitating articles under plating treatment within said barrel, said agitating means being fixedly disposed within said hollow barrel and comprising a central electrode disposed at said axis of said barrel, a plurality of conductive rods connected to said central electrode and extending radially therefrom, and a plurality of agitating ball-like bodies attached to the unconnected ends of respective said rods, wherein
    said rods are of progressively varying lengths with the rods closest the two ends of said barrel being the longest and the rod closed to the middle of said barrel being the shortest.

2. A barrel plating apparatus as claimed in claim 1 wherein said rods are inclined in a direction of barrel rotation such that an axis of each rod extends at angle in a range of 5 to 20 degrees to a perpendicular extending through a center of said central electrode.

3. A barrel plating apparatus as claimed in claim 1 wherein each of said agitating bodies has an inverted onion shaped and an elongated section, with a diameter to length ratio set in a range of 1:1.5 to 1:2.

4. A barrel plating apparatus as claimed in claim 1 wherein said agitating bodies comprise metallic balls for use in electroplating.

5. A barrel plating apparatus as claimed in claim 1 wherein said hollow barrel has a polygonal configuration.

6. A barrel plating apparatus as claimed in claim 1 wherein said means for rotating comprises DC geared motor.

7. A barrel plating apparatus as claimed in claim 1 wherein said hollow barrel is rotatable at a rate of 16 to 18 rpm.

8. The apparatus of claim 1, wherein said agitating bodies comprise heat resisting plastic balls for use in electroless plating.

* * * * *